United States Patent
Park et al.

(10) Patent No.: US 9,120,668 B2
(45) Date of Patent: Sep. 1, 2015

(54) MICROPHONE PACKAGE AND MOUNTING STRUCTURE THEREOF

(71) Applicant: SAMSUNG ELECTRO-MECHANICS CO., LTD., Suwon-Si, Gyeonggi-Do (KR)

(72) Inventors: Heung Woo Park, Suwon-Si (KR); Jong Woo Han, Suwon-Si (KR); Tae Hyun Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/268,536

(22) Filed: May 2, 2014

(65) Prior Publication Data

US 2015/0137284 A1    May 21, 2015

(30) Foreign Application Priority Data

Nov. 21, 2013    (KR) .................. 10-2013-0141958

(51) Int. Cl.
- *B81B 3/00*    (2006.01)
- *B81B 7/00*    (2006.01)
- *B81B 7/02*    (2006.01)

(52) U.S. Cl.
CPC ....... *B81B 7/0077* (2013.01); *B81B 2201/0257* (2013.01)

(58) Field of Classification Search
None
See application file for complete search history.

(56) References Cited

U.S. PATENT DOCUMENTS

| 6,781,231 | B2 | 8/2004 | Minervini | |
|---|---|---|---|---|
| 7,242,089 | B2 | 7/2007 | Minervini | |
| 8,018,049 | B2 | 9/2011 | Minervini | |
| 2005/0185812 | A1 | 8/2005 | Minervini | |
| 2006/0237806 | A1* | 10/2006 | Martin et al. | 257/415 |
| 2010/0269590 | A1* | 10/2010 | Guenther et al. | 73/514.15 |
| 2010/0303273 | A1 | 12/2010 | Sawada | |
| 2011/0198714 | A1* | 8/2011 | Yang | 257/416 |
| 2012/0319256 | A1* | 12/2012 | Lo et al. | 257/666 |
| 2013/0241045 | A1* | 9/2013 | Goida et al. | 257/704 |
| 2014/0045290 | A1* | 2/2014 | Horimoto et al. | 438/51 |
| 2014/0191233 | A1* | 7/2014 | Gehl et al. | 257/48 |

FOREIGN PATENT DOCUMENTS

| JP | 2010-283418 A | 12/2010 |
|---|---|---|
| KR | 2008-0005779 U | 12/2008 |

* cited by examiner

*Primary Examiner* — Joseph Schoenholtz
(74) *Attorney, Agent, or Firm* — NSIP Law

(57) ABSTRACT

There are provided a microphone package and a mounting structure thereof, allowing for an increase in a back volume, the microphone package including: a package substrate; an acoustic element mounted on the package substrate and having a space formed in a lower portion thereof; and at least one electronic component mounted on the package substrate and having a space formed in a lower portion thereof, wherein the package substrate includes an acoustic volume connecting the space of the acoustic element and the space of the electronic component.

20 Claims, 9 Drawing Sheets

MICROPHONE PACKAGE AND MOUNTING STRUCTURE THEREOF

CROSS-REFERENCE TO RELATED APPLICATION

This application claims the benefit of Korean Patent Application No. 10-2013-0141958 filed on Nov. 21, 2013, with the Korean Intellectual Property Office, the disclosure of which is incorporated herein by reference.

BACKGROUND

The present disclosure relates to a microphone package and a mounting structure thereof, and more particularly, to a microphone package allowing for ease in forming a back volume, and a mounting structure thereof.

Recently, as volumes of electronic products such as cellular phones, notebook computers, and the like have been reduced and performance requirements for the electronic product increased, the volume of components installed in electronic products has gradually been reduced, while performances thereof have been required to be improved.

In accordance with the trend, many products in the field of microphone products have been developed as main components. An example of the microphone product is a micro electro mechanical systems (MEMS) microphone mass-produced using semiconductor manufacturing technologies.

In a microphone according to the related art, a back volume is formed below or behind a MEMS sound device. The term "back volume" may refer to a space opposite to a surface on which soundwaves and MEMS sound components meet, and may also be referred to as a ' cavity back or back side cavity'. In general, it is known that when cavity volume of a back volume is increased, microphone sensitivity is further increased, and a better frequency response curve may be achieved.

However, in a microphone package according to the related art, back volume is formed as a very narrow space and it is difficult to increase volume of the back volume in a structure thereof.

RELATED ART DOCUMENT (Patent Document 1) Korean Utility Model Laid-Open Publication No. 2008-0005779

SUMMARY

An aspect of the present disclosure may provide a microphone package and a mounting structure thereof, allowing for an increase in a back volume.

According to an aspect of the present disclosure, a microphone package may include a package substrate; an acoustic element mounted on the package substrate and having a space formed in a lower portion thereof; and at least one electronic component mounted on the package substrate and having a space formed in a lower portion thereof, wherein the package substrate includes an acoustic volume connecting the space of the acoustic element and the space of the electronic component.

The acoustic volume may be formed in a tunnel shape in the package substrate.

The acoustic volume may include a tunnel portion formed in the package substrate; and tunnel entrances extending from both ends of the tunnel portion and opened to the outside of the package substrate.

The acoustic element and the electronic component may be mounted on the package substrate to block the tunnel entrances, respectively.

The space formed in the acoustic element and the space formed in the electronic component, and the acoustic volume formed in the package substrate may be connected to form a back volume.

The acoustic volume may include a plurality of through holes penetrating through the package substrate.

The acoustic element and the electronic component may be mounted on the package substrate to block entrances of the through holes.

A ring-shaped partition part may be formed on a lower surface of the package substrate in such a manner that the through holes are disposed in an inner portion of the ring-shaped partition part.

The partition part may be adhered to a main substrate on which the package substrate is mounted, to separate an internal space and an external space.

The package substrate may include a tunnel portion formed in the package substrate in a tunnel form and connecting the through holes to each other.

At least one groove may be formed in a lower surface of the package substrate between the through holes.

The groove formed in the lower surface of the package substrate may partially include the through holes and connect the through holes to each other.

The microphone package may further include an auxiliary substrate adhered to the lower portion of the package substrate.

The auxiliary substrate may include a through portion formed therein and connected to the through holes formed in the package substrate.

The microphone package may further include a partition part interposed between the package substrate and the auxiliary substrate and formed in a ring shape to separate an internal space and an external space, wherein the through holes are connected to the internal space of the partition part.

According to another aspect of the present disclosure, a mounting structure of a microphone package may include a main structure; a package substrate including a plurality of through holes formed therein and mounted on the main substrate; an acoustic element mounted on the package substrate to block one of the through holes and having a space formed in a lower portion thereof; and at least one electronic component mounted on the package substrate to block another of the through holes and having a space formed in a lower portion thereof.

The mounting structure may further include a partition part interposed between the package substrate and the main substrate to surround the through holes.

The main substrate may include at least one groove formed in one surface thereof disposed in an internal space of the partition part.

According to another aspect of the present disclosure, a mounting structure of a microphone package may include a main substrate; an auxiliary substrate including a through portion formed therein and mounted on the main substrate; a package substrate including a plurality of through holes formed therein and mounted on the auxiliary substrate; an acoustic element mounted on the package substrate to block one of the through holes and having a space formed in a lower portion thereof; and at least one electronic component mounted on the package substrate to block another of the through holes and having a space formed in a lower portion thereof.

The mounting structure may further include a first partition part interposed between the package substrate and the auxiliary substrate to surround the through holes; and a second partition part interposed between the auxiliary substrate and the main substrate to surround a circumference of the through portion.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
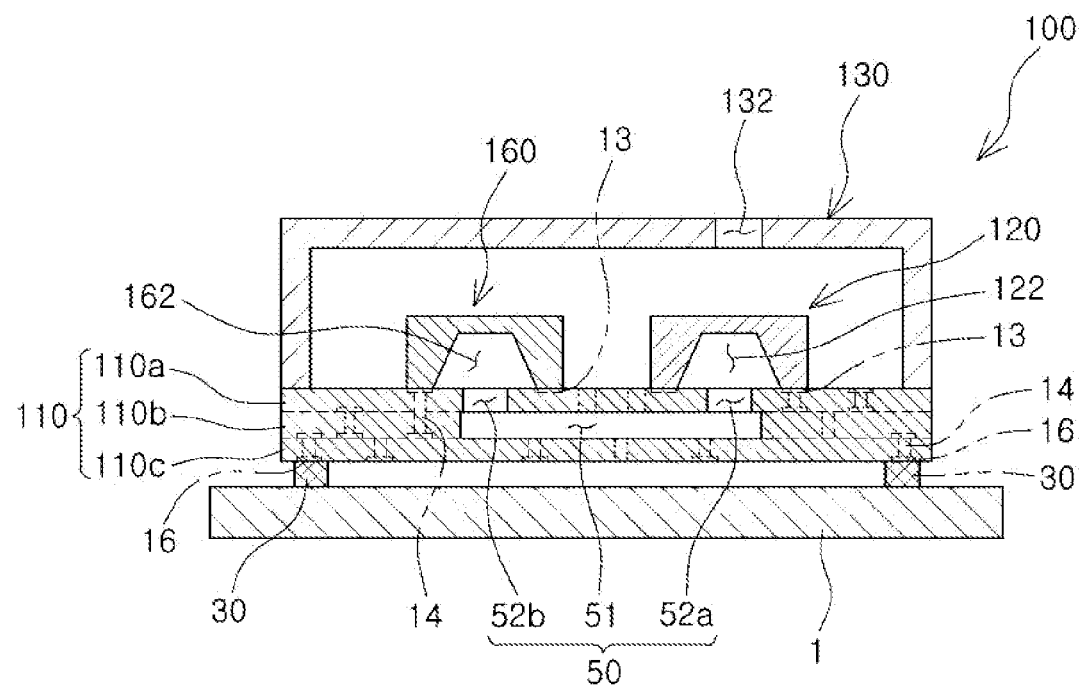
FIG. 1 is a cross-sectional view of a microphone package according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

FIG. 1 is a cross-sectional view of a microphone package 100 according to an exemplary embodiment of the present disclosure.

Referring to FIG. 1, the microphone package 100 according to the exemplary embodiment may include a package substrate 110, an acoustic element 120, an electronic component 160, and a cover 130. In addition, the microphone package 100 may further include other devices required for an operation of the acoustic element 120.

The microphone package 100 configured as described above may be installed in a portable electronic component, may detect sound containing voice information, and may convert the detected sound into electrical signals.

Hereinafter, a main structure of the microphone package 100 will be described.

As the package substrate 110, various types of substrate such as a ceramic substrate, a printed circuit board, a flexible substrate, and the like, well known in the art to which the present disclosure pertains, may be used. In addition, mounting electrodes 13 for mounting the acoustic element 120 or the electronic component 160 or wiring patterns for electrically connecting the mounting electrodes 13 to each other may be formed on at least one surface of the package substrate 110.

The package substrate 110 according to the exemplary embodiment may be a multilayer substrate including a plurality of layers, and circuit patterns (not shown) for forming electrical connections may be formed between the layers. However, embodiments of the present disclosure are not limited thereto. That is, the package substrate 110 may be formed as a single substrate.

The package substrate 110 according to the exemplary embodiment may include conductive vias 14 electrically connecting the mounting electrodes 13 formed on opposite surfaces of the package substrate 110 and circuit patterns formed within the package substrate 110.

External connection pads 16 may be formed on a lower surface of the package substrate 110 according to the exemplary embodiment. The external connection pads 16 may be used for electrical connection with a main substrate 1 or an auxiliary substrate and may be adhered to external terminals 30.

In addition, at least one or more electronic components may be mounted or installed on the package substrate 110. Here, the electronic components may include both a passive component and an active component.

The package substrate 110 according to the exemplary embodiment may include an acoustic volume 50 that forms a back volume of the acoustic element 120. The acoustic volume 50 may be formed in various shapes as long as the acoustic volume 50 may form a back volume. In the exemplary embodiment, the acoustic volume 50 is formed in a tunnel shape.

In more detail, the acoustic volume 50 according to the exemplary embodiment may include a tunnel portion 51 formed in the package substrate 110, and at least two tunnel entrances 52 extending from both ends of the tunnel portion 51 and opened to the outside of the package substrate 110.

To this end, the package substrate 110 may be a multilayer substrate in which at least three layers 110a, 110b, and 110c are stacked. In detail, the package substrate 110 may include a first substrate layer 110a on which the acoustic element 120 and the electronic component 160 to be described later are mounted, a second substrate layer 110c forming a bottom surface of the package substrate 110, and a third substrate layer 110b interposed between the first substrate layer 110a and the second substrate layer 110c.

Accordingly, the tunnel entrances 52 may be formed in the first substrate layer 110a and the tunnel portion 51 may be formed in the third substrate layer 110b.

The package substrate 110 may be mounted on the main substrate 1 and may be electrically connected to the main substrate 1 through a plurality of the external terminals 30. Here, the external terminals 30 may be solder balls, solder bumps, or the like but are not limited thereto.

The exemplary embodiment may be modified in various forms. For example, the lower surface of the package substrate 110 comes into surface contact with a surface of the main substrate 1 to be adhered thereto and then is electrically connected to the main substrate 1 via bonding wire.

The acoustic element 120 may be a general silicon condenser microphone device and may be manufactured by micro electro mechanical systems (MEMS).

The acoustic element 120 may convert sound into electrical signals using capacitance that varies according to movement of a vibration plate vibrating by sound. To this end, the acoustic element 120 may include a diaphragm and a back plate, and have a groove 122 formed in a lower surface of the acoustic element 120, the groove 122 extending inwardly or upwardly of the acoustic element 120.

Here, the groove 122 may be a back volume (also, referred to as "a back side cavity") included in the acoustic element 120.

In addition, the acoustic element 120 may be mounted to block a tunnel entrance 52a (hereinafter, a first tunnel entrance 52a) on one surface of the package substrate 110. In this case, the first tunnel entrance 52a may be adhered to the acoustic element 120 so as to contact the lower surface of the acoustic element 120, that is, an entrance of the groove 122.

Thus, when the acoustic element 120 is mounted on the package substrate 110, the first tunnel entrance 52a is blocked by the acoustic element 120, thereby forming a space including the back volume of the acoustic element 120.

The electronic component 160 may be a customized electronic component 160 such as an application-specific integrated circuit (ASIC). However, embodiments of the present disclosure are not limited thereto. That is, the electronic component 160 may include other general electronic components, and semiconductor devices.

In addition, the electronic component 160 may have a groove 162 formed in a lower surface of the electronic component 160, the groove 162 extending inwardly or upwardly of the electronic component 160. Here, the groove 162 may be a back volume (back side cavity) that is additionally formed in the electronic component 160.

Conventionally, electronic components are mounted on a package substrate, but are not used to expand back volume and do not include back volume spaces. However, the electronic component 160 according to the exemplary embodiment includes a back volume space and expands the overall size of a back volume of the microphone package 100 due to the presence of the back volume space.

When a thickness (or a height) of the electronic component 160 is low, a depth of the groove 162 formed in the electronic component 160 is small, and thus, the volume of the groove 162 may be very small. Accordingly, the electronic component 160 according to the exemplary embodiment may be formed to have a mounting height corresponding to that of the acoustic element 120. For example, the electronic component 160 may have the same mounting height as the acoustic element 120 or may be configured to have a maximum mounting height as high as possible in an internal space of the cover 130.

In addition, the electronic component 160 may be mounted to block another tunnel entrance 52b (hereinafter, a second entrance 52b) on one surface of the package substrate 110. In this case, the second entrance 52b may be adhered to the electronic component 160 so as to contact the lower surface of the electronic component 160, that is, an entrance of the groove 162.

Thus, when the electronic component 160 is mounted on the package substrate 110, the second entrance 52b is blocked by the electronic component 160, thereby forming a space including the back volume of the electronic component 160.

The acoustic element 120 and the electronic component 160 may be electrically connected via wiring patterns, bonding wire, or the like, of the package substrate 110.

The cover 130 may be formed of a metallic material. However, the cover 130 is not necessarily formed of a metallic material, and the cover 130 may be formed of mixture including a metallic powder.

The cover 130 may be formed to cover the acoustic element 120 and the electronic component 160. Through the cover 130, the acoustic element 120 and the electronic component 160 may be protected from harmful electromagnetic waves.

At least one acoustic hole 132 may be formed in the cover 130. The acoustic hole 132 may be used as a path for introducing or discharging sound.

The microphone package 100 according to the present disclosure configured as described above may be formed in such a manner that the groove 162 is formed in a lower portion of the electronic component 160 while the groove 122 is formed in a lower portion of the acoustic element 120, thereby serving as a back volume.

In addition, the acoustic volume 50 is formed in a tunnel shape in the package substrate 110 and connects spaces 122 and 162 formed in the acoustic element 120 and the electronic component 160 to each other.

Accordingly, an overall size of the back volume may be increased while maintaining an overall volume of the microphone package 100, thereby enhancing performance of the microphone package 100.

The microphone package according to the present disclosure is not limited to the foregoing embodiment and may be modified in various manners.

Figure 2:
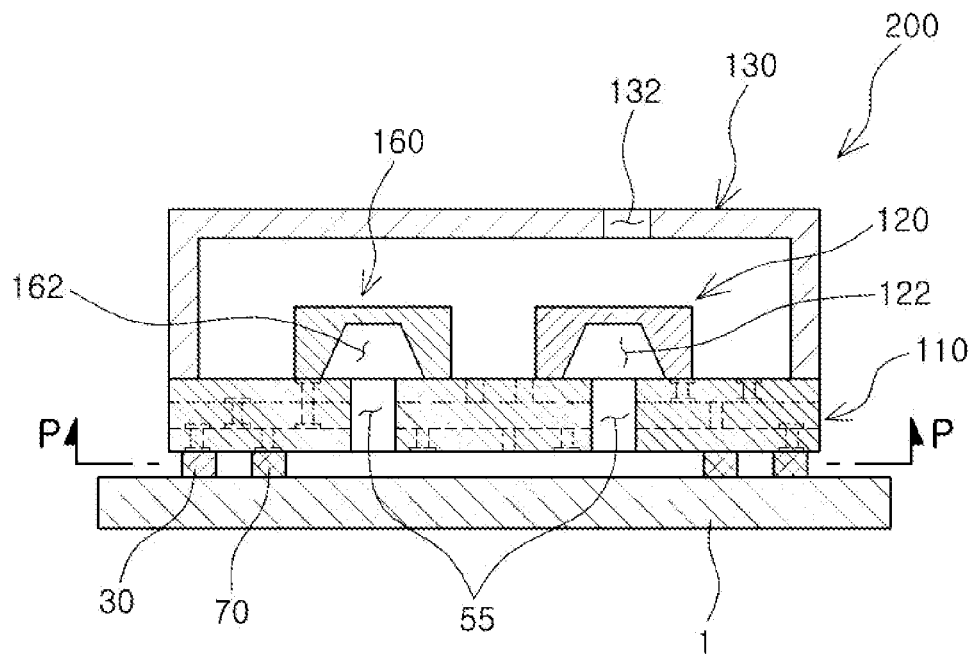
FIG. 2 is a schematic cross-sectional view of a microphone package according to another embodiment of the present disclosure.
Figure 3:
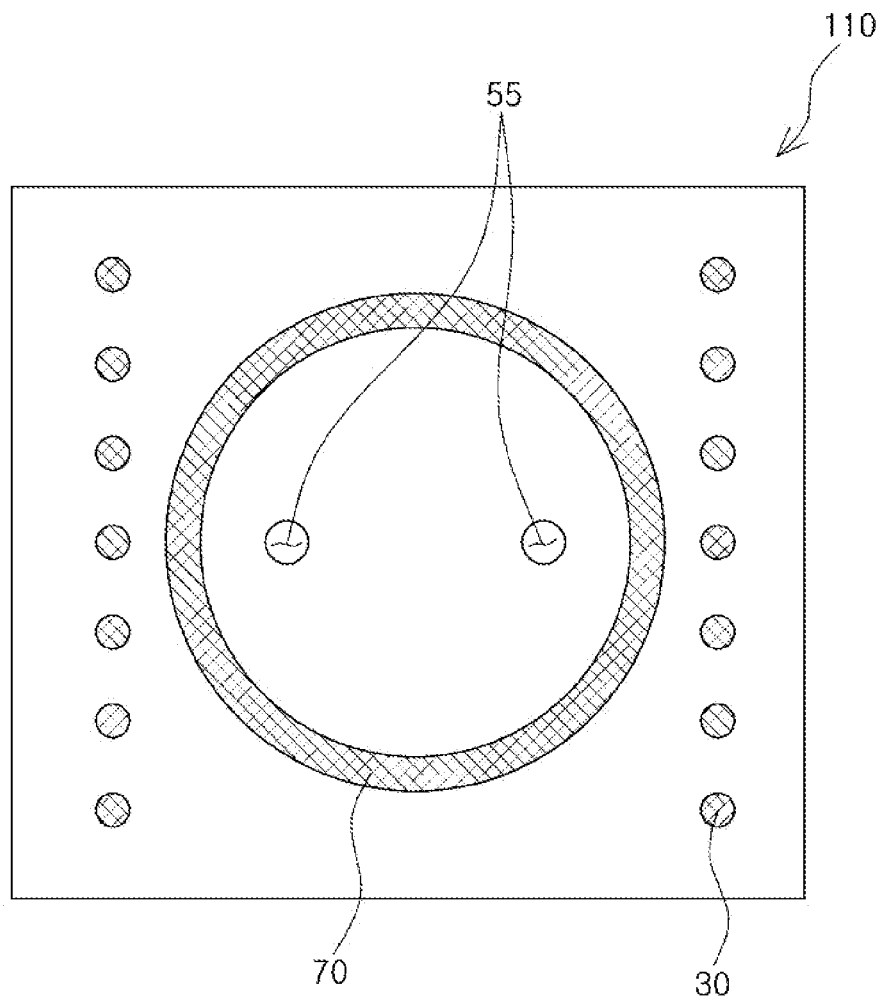
FIG. 3 is a cross-sectional view of the microphone package taken long line P-P of FIG. 2.

FIG. 2 is a schematic cross-sectional view of a microphone package 200 according to another embodiment of the present disclosure. FIG. 3 is a cross-sectional view of the microphone package 200 taken long line P-P of FIG. 2.

Referring to FIGS. 2 and 3, the microphone package 200 according to the exemplary embodiment is similar to the aforementioned embodiment except for the structure of the package substrate 110. Accordingly, detailed descriptions of elements the same as those of previously detailed embodiments are omitted, and the structure of the package substrate 110 will be described in detail.

The microphone package 200 according to the exemplary embodiment is configured in such a manner that at least two through holes 55 are formed in the package substrate 110. The through holes 55 may be formed by penetrating through the package substrate 110 in a vertical direction. However, embodiments of the present disclosure are not limited thereto. That is, the through holes 55 may be formed in a diagonal direction or in a direction that varies in the package substrate 110.

The acoustic element 120 and the electronic component 160 are mounted on one surface of the package substrate 110. In this case, the acoustic element 120 and the electronic component 160 are respectively mounted on entrances of the through holes 55 to block one ends of the through holes 55.

A partition part 70 connecting the main substrate 1 and the package substrate 110 is formed on the other surface of the package substrate 110. The partition part 70 may include all the other ends of the through holes 55 within an inner portion thereof. Thus, the through holes 55 may be blocked by the partition part 70 from the outside and are formed as an encapsulated space.

The partition part 70 may be formed as a barrier rib using conductive adhesives, resin adhesives, or the like. That is, the partition part 70 may be formed of various types of material as long as the partition part 70 is interposed between the package substrate 110 and the main substrate 1 to separate an internal space from an external space.

An internal space of the partition part 70 is used as a back volume (back side cavity).

That is, the back volume of the microphone package 200 according to the exemplary embodiment may include spaces 122 and 162 that are basically included in the acoustic element 120 and the electronic component 160, spaces formed by the through holes 55, and spaces formed by the partition part 70 between the package substrate 110 and the main substrate 1.

Accordingly, the size of back volume may be further increased compared with a microphone package according to the related art.

In the exemplary embodiment, the internal space formed by the partition part 70 is formed in a circular form as shown in FIG. 3. However, embodiments of the present disclosure are not limited thereto. That is, as necessary, the internal space may be formed in various manners.

FIGS. 4 to 7 are views illustrating a method of manufacturing the microphone package illustrated in FIG. 2.

Figure 4:
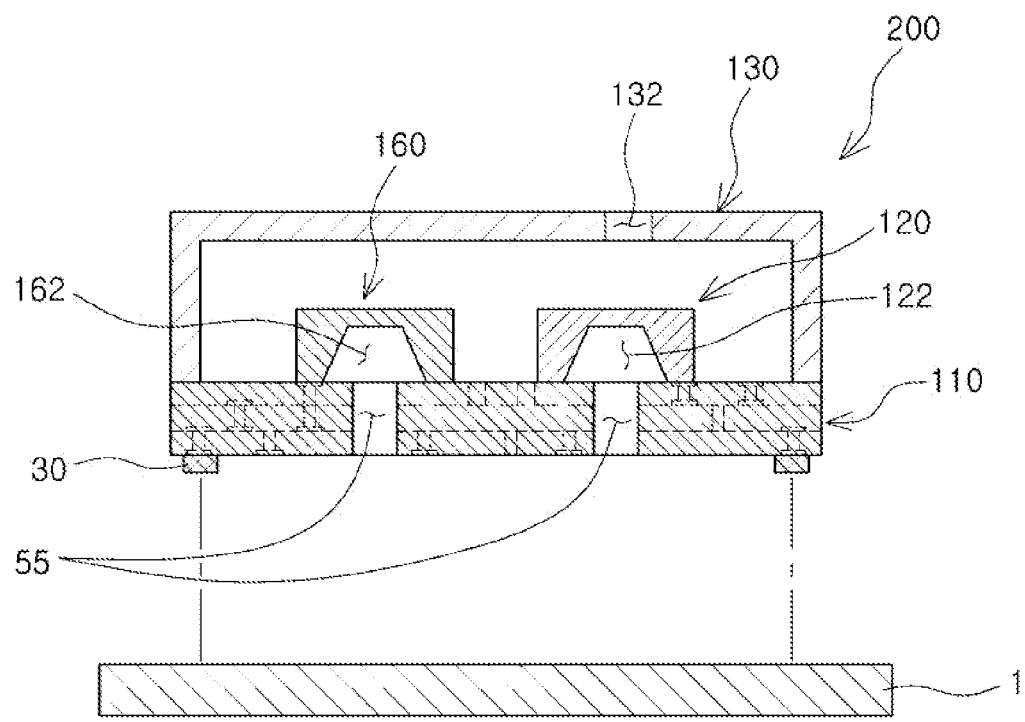
FIGS. 4 to 7 are views illustrating a method of manufacturing the microphone package illustrated in FIG. 2.

With reference to FIGS. 4 to 7, the method of manufacturing the microphone package will now be described. First, as illustrated in FIG. 4, the acoustic element 120 and the electronic component 160 are mounted on the package substrate 110 in which the through holes 55 are formed, and the microphone package coupled to the cover 130 and the main substrate 1 are prepared.

Figure 5:
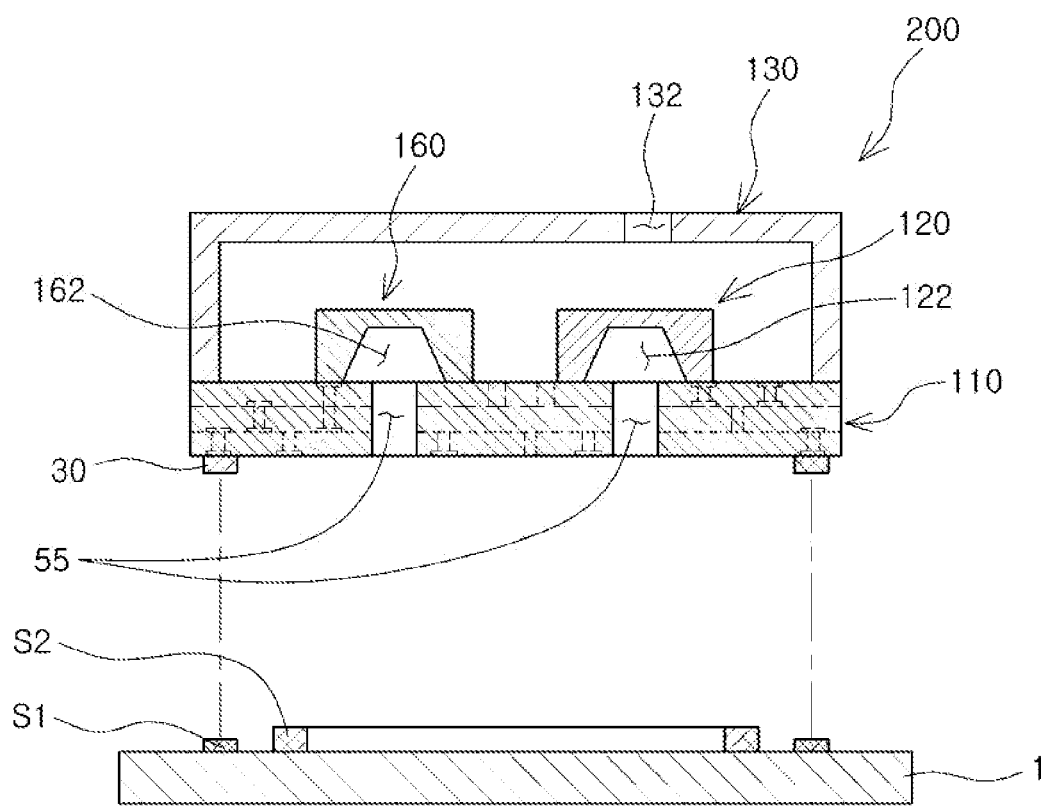

Then, as illustrated in FIG. 5, conductive adhesives S1 and S2 such as solder paste are applied to one surface of the main substrate 1. In this case, the conductive adhesives S1 and S2 may be applied to all of positions (indicated as S1) in which the external terminals 30 of the microphone package are mounted and positions (indicated as S2) in which the partition part 70 is formed.

That is, the partition part 70 according to the exemplary embodiment may be formed by the conductive adhesive for forming electrical connections and adherence between the microphone package 200 and the main substrate 1.

Then, the microphone package 200 is accommodated on the main substrate 1, and then the conductive adhesives are melted and hardened, such that a mounting process may be completed, as illustrated in FIG. 2.

Accordingly, the external terminals 30 of the microphone package 200 are electrically connected to the main substrate 1, and the partition part 70 is formed between the main substrate 1 and the package substrate 110 of the microphone package 200 to complete an encapsulated back volume.

As illustrated in FIG. 5, the partition part 70 may be formed by applying the conductive adhesive S2 in a continuous ring shape along a shape of the partition part 70 illustrated in FIG. 3. However, embodiments of the present disclosure are not limited thereto.

Figure 6:
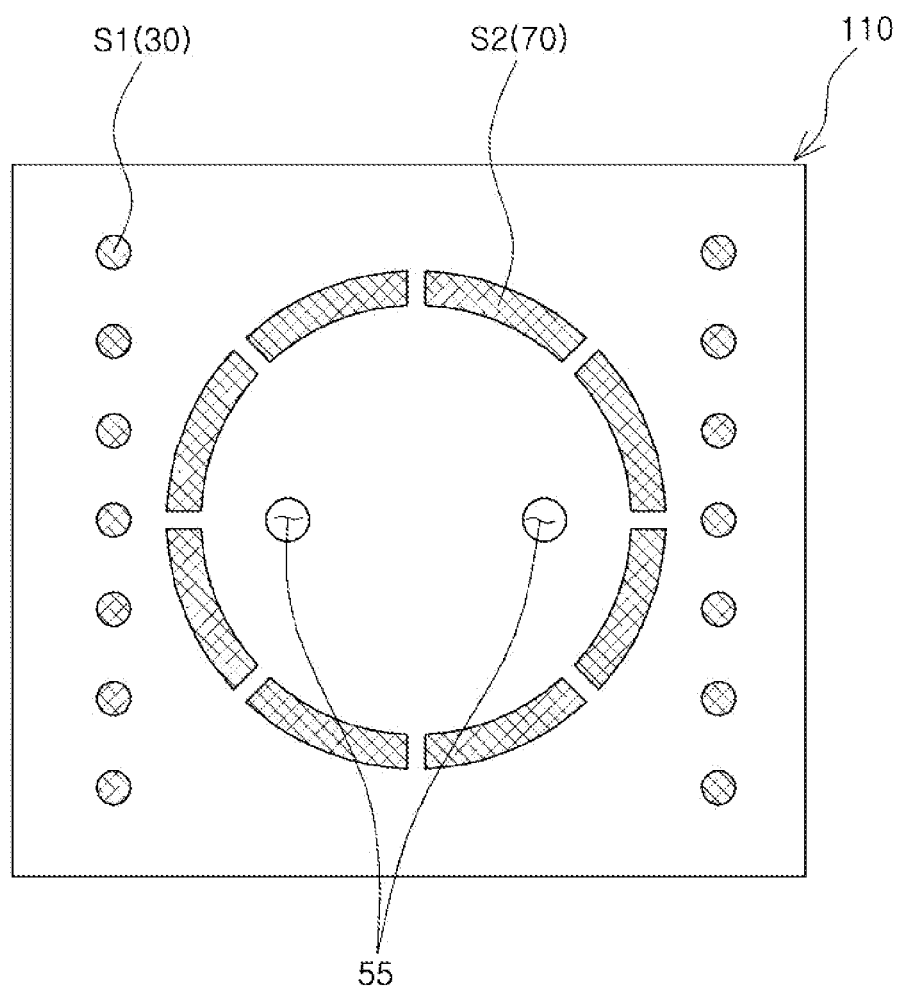
Figure 7:
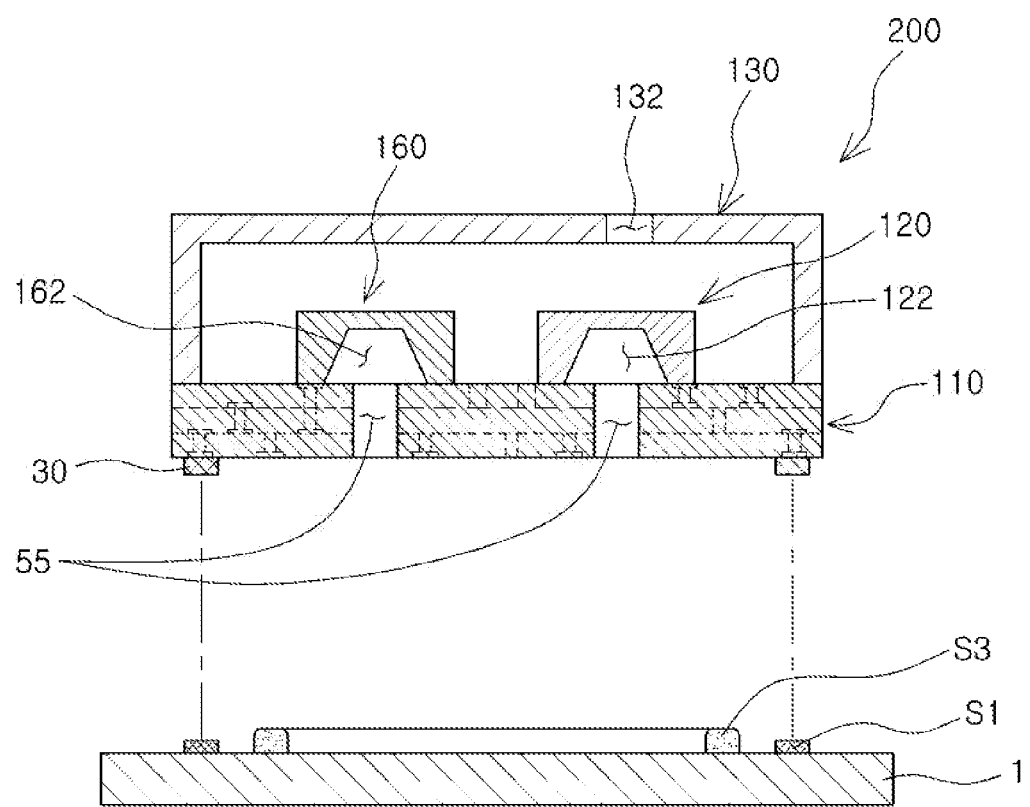

For example, as illustrated in FIG. 6, the conductive adhesive S2 may be applied in a broken line shape along positions in which the partition part 70 is discontinuously formed. In this case, portions to which the conductive adhesive S2 is not applied are connected to each other during a melting and hardening process of the conductive adhesive S2, and thus, the partition part 70 may be finally formed in a continuous ring shape.

In the aforementioned manufacturing method, the partition part 70 may be formed using a conductive adhesive. However, the present disclosure is not limited thereto.

For example, in the aforementioned operation of FIG. 5, the conductive adhesive S1 may be only applied to the positions in which the external terminals 30 are mounted, and a resin S3 is applied or adhesive tape S3 is adhered to the positions in which the partition part 70 is formed, whereby the partition part 70 may be formed. In addition, various applications may be used. For example, the partition part 70 may be formed using a pre-manufactured ring structure.

Figure 8:
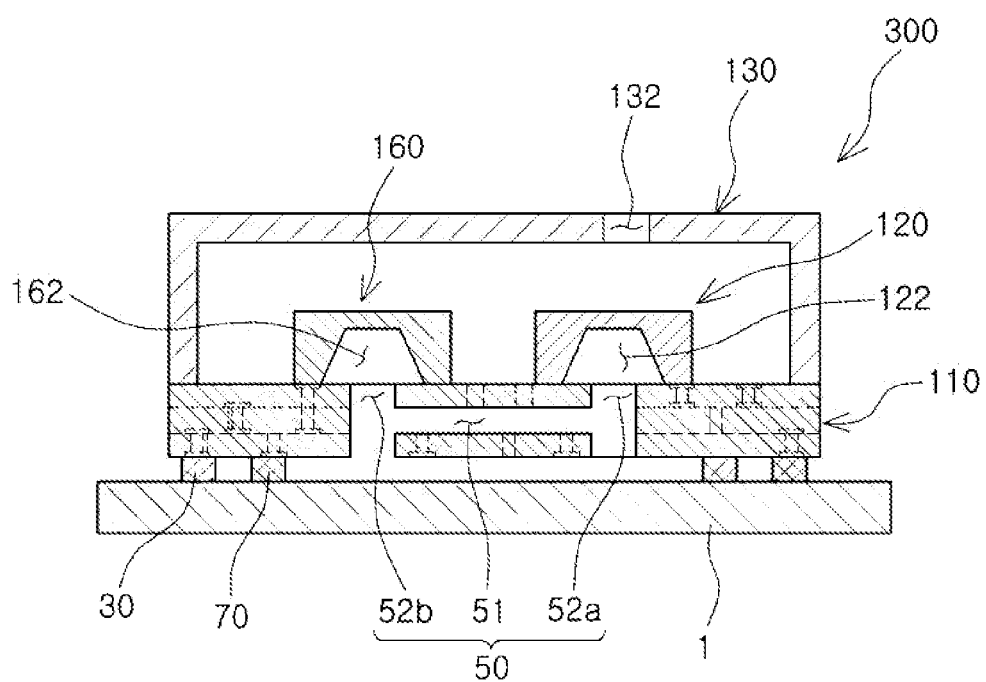
FIGS. 8 and 9 are schematic cross-sectional views illustrating modified examples of the microphone package illustrated in FIG. 3.
Figure 9:
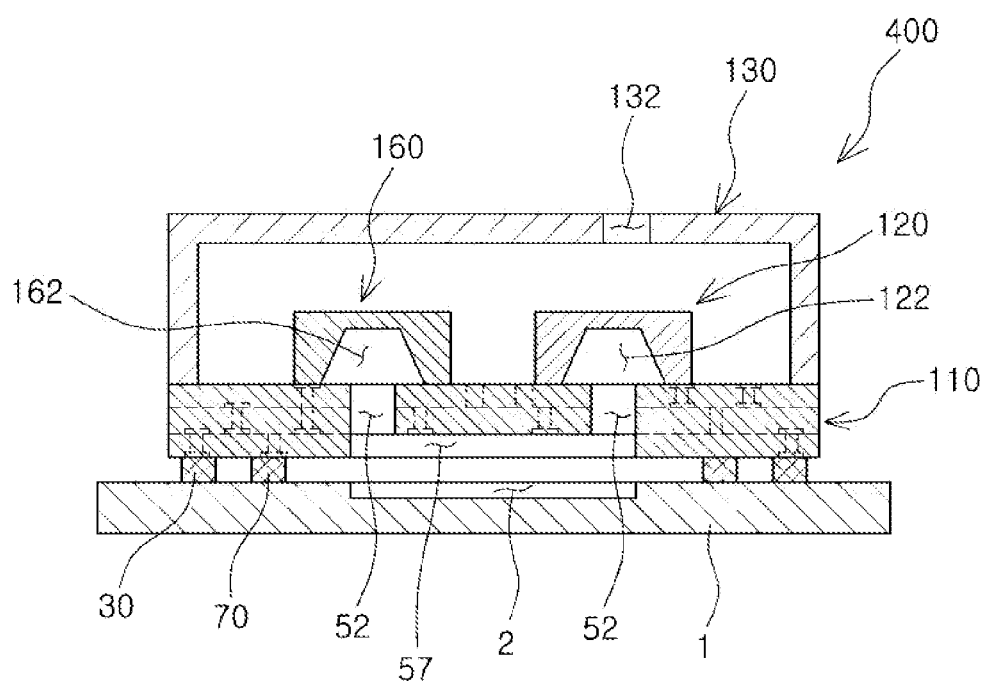

FIGS. 8 and 9 are schematic cross-sectional views illustrating modified examples of the microphone package illustrated in FIG. 3.

Referring to FIG. 8, a microphone package 300 according to the exemplary embodiment is similar to the microphone package 100 illustrated in FIG. 1 in that the tunnel portion 51 is formed in the package substrate 110. In this case, a back volume may be further increased in an amount equal to a space of the tunnel portion 51.

Referring to FIG. 9, in the package substrate 110 of a microphone package 400 according to the exemplary embodiment, a groove 57 may be formed between through holes 52.

In the mounting structure of the microphone package 400 according to the exemplary embodiment, a groove 2 may be formed in the main substrate 1, as well as a groove being formed in the microphone package 400. Here, the groove 2 of the main substrate 1 is formed in an internal space partitioned by the partition parts 70.

When the groove 57 is formed in the lower surface of the package substrate 110 or the groove 2 is formed in the main substrate 1, a back volume may be further increased in an amount equal to spaces formed by the grooves 57 and 2.

FIG. 9 illustrates a case in which the microphone package 400 is configured in such a manner that the grooves formed in the package substrate 110 partially include the two through holes 52 and connect the through holes 52 to each other. However, the present disclosure is not limited thereto. That is, various applications may be used. For example, a plurality of grooves may be formed between the through holes 52 or different grooves are further formed in a single groove.

In addition, in the exemplary embodiment, the respective grooves are formed in the microphone package 400 and the main substrate 1. However, the present disclosure is not limited thereto. That is, a groove may be formed only in any one of the microphone package 400 and the main substrate 1.

Figure 10:
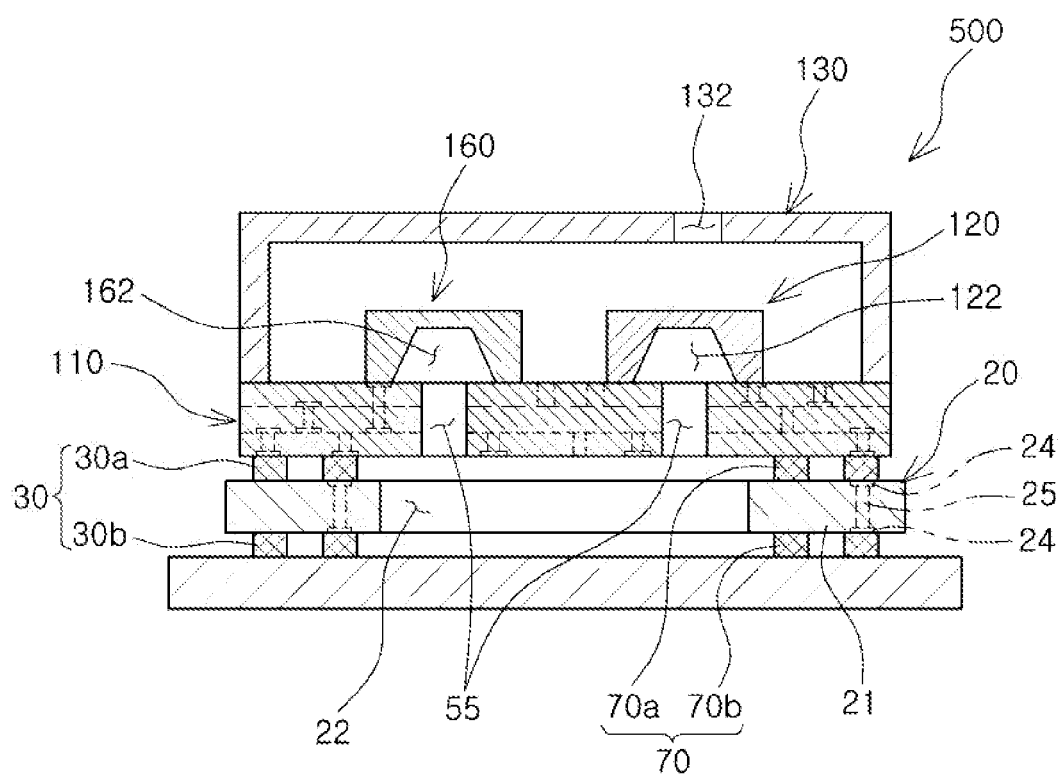
FIG. 10 is a schematic view of a microphone package according to another embodiment of the present disclosure.

FIG. 10 is a schematic view of a microphone package 500 according to another embodiment of the present disclosure.

Referring to FIG. 10, a mounting structure of the microphone package 500 according to the exemplary embodiment includes an auxiliary substrate 20.

The auxiliary substrate 20 may be interposed between the microphone package 500 and the main substrate 1 and may include an insulating layer 21 and external terminals 30b.

The auxiliary substrate 20 is disposed below the package substrate 110 of the microphone package 500 and is coupled to the package substrate 110.

As the auxiliary substrate 20, various types of substrate such as a ceramic substrate, a printed circuit board, a flexible substrate, or the like, well known in the art to which the present disclosure pertains, may be used in a similar manner to the package substrate 110.

Electrode pads 24 may be formed on opposite surfaces of the insulating layer 21. The electrode pads 24 formed on an upper surface of the auxiliary substrate 20 are used for electrical connection with external terminals 30a of the package substrate 110. In addition, the electrode pads 24 formed on a lower surface of the auxiliary substrate 20 are used for coupling with the external terminals 30b of the auxiliary substrate 20.

Conductors 25 for electrical connection between the electrode pads 24 formed on the opposite surfaces may be formed in the insulating layer 21.

The external terminals 30b of the auxiliary substrate 20 may be formed on the lower surface of the insulating layer 21 and the electrode pads 24 may be electrically and physically connected to the main substrate 1.

The auxiliary substrate 20 according to the exemplary embodiment may be a multilayer substrate including a plurality of layers, and circuit patterns (not shown) for electrical connections between the layers may be formed. However, the present disclosure may not be limited thereto. That is, the auxiliary substrate 20 may be formed as a single layer package substrate.

The auxiliary substrate 20 according to the exemplary embodiment may be formed by preparing a plurality of insulating layers in which vias are formed and then stacking the insulating layers to electrically connect the vias, or by stacking a plurality of insulating layers, forming through holes penetrating through all of the insulating layers, and then, forming vias in the through holes. Alternatively, the auxiliary substrate 20 may be formed in various manners by preparing one resin layer (e.g., epoxy, or the like) and forming a plurality of metallic posts (e.g., a Cu post) penetrating through the resin layer to be surrounded by the resin layer.

A through portion 22 having a through hole form is formed in the auxiliary substrate 20 according to the exemplary embodiment. The through portion 22 is used as a space for expanding the size of the back volume. Accordingly, the through portion 22 may be formed to have a size and a shape such that it is connected to all of entrances of the through holes 55 formed in the package substrate 110.

In addition, in a similar manner to the aforementioned embodiment, the partition parts 70 are formed on the upper portion and lower portion of the auxiliary substrate 20. A first partition part 70a is interposed between the package substrate 110 and the auxiliary substrate 20 to surround the through holes 55, thereby comparting a back volume space. A second partition part 70b is interposed between the auxiliary substrate 20 and the main substrate 1 to surround the through portion 22, thereby comparting a back volume space.

The mounting structure of the microphone package including the auxiliary substrate according to the exemplary embodiment may use a through hole space of the auxiliary substrate as well as through holes formed in the package substrate as a back volume, thereby ensuring a significantly increased back volume.

As set forth above, according to exemplary embodiments of the present disclosure, a microphone package is configured in such a manner that a groove is formed in a lower portion of an electronic component as well as formed in a lower portion of an acoustic element, thereby being used as a back volume.

In addition, an acoustic volume is formed in a package substrate in the form of a tunnel or through holes so as to connect spaces formed between the acoustic element and the electronic component.

Accordingly, the size of the back volume may be increased while maintaining an overall volume of the microphone package, thereby enhancing performance of the microphone package.

While exemplary embodiments have been shown and described above, it will be apparent to those skilled in the art that modifications and variations could be made without departing from the spirit and scope of the present disclosure as defined by the appended claims.

What is claimed is:

1. A microphone package comprising:
   a package substrate;
   an acoustic element mounted on the package substrate and having a space formed in a lower portion thereof; and
   at least one electronic component mounted on the package substrate and having a space formed in a lower portion thereof, the space extending inwardly of the electronic component, wherein the package substrate includes an acoustic volume connecting the space of the acoustic element and the space of the electronic component.

2. The microphone package of claim 1, wherein the acoustic volume is formed in a tunnel shape in the package substrate.

3. A microphone package comprising:
   a package substrate;
   an acoustic element mounted on the package substrate and having a space formed in a lower portion thereof; and
   at least one electronic component mounted on the package substrate and having a space formed in a lower portion thereof,
   wherein the package substrate includes an acoustic volume connecting the space of the acoustic element and the space of the electronic component,
   wherein the acoustic volume includes:
   a tunnel portion formed in the package substrate; and tunnel entrances extending from both ends of the tunnel portion and opened to the outside of the package substrate.

4. The microphone package of claim 3, wherein the acoustic element and the electronic component are mounted on the package substrate to block the tunnel entrances, respectively.

5. The microphone package of claim 4, wherein the space formed in the acoustic element and the space formed in the electronic component, and the acoustic volume formed in the package substrate are connected to form a back volume.

6. A microphone package comprising:
   a package substrate;
   an acoustic element mounted on the package substrate and having a space formed in a lower portion thereof; and
   at least one electronic component mounted on the package substrate and having a space formed in a lower portion thereof,
   wherein the package substrate includes an acoustic volume connecting the space of the acoustic element and the space of the electronic component,
   wherein the acoustic volume includes a plurality of through holes penetrating through the package substrate.

7. The microphone package of claim 6, wherein the acoustic element and the electronic component are mounted on the package substrate to block entrances of the through holes.

8. The microphone package of claim 7, wherein a ring-shaped partition part is formed on a lower surface of the package substrate in such a manner that the through holes are disposed in an inner portion of the ring-shaped partition part.

9. The microphone package of claim 8, wherein the partition part is adhered to a main substrate on which the package substrate is mounted, to separate an internal space and an external space.

10. The microphone package of claim 7, wherein the package substrate includes a tunnel portion formed in the package substrate in a tunnel form and connecting the through holes to each other.

11. The microphone package of claim 7, wherein at least one groove is formed in a lower surface of the package substrate between the through holes.

12. The microphone package of claim 11, wherein the groove formed in the lower surface of the package substrate partially includes the through holes and connects the through holes to each other.

13. The microphone package of claim 7, further comprising: an auxiliary substrate adhered to the lower portion of the package substrate.

14. The microphone package of claim 13, wherein the auxiliary substrate includes a through portion formed therein and connected to the through holes formed in the package substrate.

15. The microphone package of claim 13, further comprising: a partition part interposed between the package substrate and the auxiliary substrate and formed in a ring shape to separate an internal space and an external space,
wherein the through holes are connected to the internal space of the partition part.

16. A mounting structure of a microphone package, the mounting structure comprising:
a main structure;
a package substrate including a plurality of through holes formed therein and mounted on the main substrate;
an acoustic element mounted on the package substrate to block one of the through holes and having a space formed in a lower portion thereof; and
at least one electronic component mounted on the package substrate to block another of the through holes and having a space formed in a lower portion thereof.

17. The mounting structure of claim 16, further comprising: a partition part interposed between the package substrate and the main substrate to surround the through holes.

18. The mounting structure of claim 17, wherein at least one groove is formed in one surface of the main substrate disposed in an internal space of the partition part.

19. A mounting structure of a microphone package, the mounting structure comprising:
a main substrate;
an auxiliary substrate including a through portion formed therein and mounted on the main substrate;
a package substrate including a plurality of through holes formed therein and mounted on the auxiliary substrate;
an acoustic element mounted on the package substrate to block one of the through holes and having a space formed in a lower portion thereof; and
at least one electronic component mounted on the package substrate to block another of the through holes and having a space formed in a lower portion thereof.

20. The mounting structure of claim 19, further comprising:
a first partition part interposed between the package substrate and the auxiliary substrate to surround the through holes; and
a second partition part interposed between the auxiliary substrate and the main substrate to surround a circumference of the through portion.

* * * * *